(12) United States Patent
Smith et al.

(10) Patent No.: US 9,042,623 B2
(45) Date of Patent: May 26, 2015

(54) AUTOMATIC DETECTION AND CORRECTION OF MAGNETIC RESONANCE IMAGING DATA

(71) Applicants: David S. Smith, Nashville, TN (US); Edward B. Welch, Nashville, TN (US)

(72) Inventors: David S. Smith, Nashville, TN (US); Edward B. Welch, Nashville, TN (US)

(73) Assignee: Vanderbilt University, Nashville, TN (US)

(*) Notice: Subject to any disclaimer, the term of this patent is extended or adjusted under 35 U.S.C. 154(b) by 56 days.

(21) Appl. No.: 13/785,574

(22) Filed: Mar. 5, 2013

(65) Prior Publication Data

US 2013/0236075 A1 Sep. 12, 2013

Related U.S. Application Data

(60) Provisional application No. 61/607,683, filed on Mar. 7, 2012.

(51) Int. Cl.
*G06T 7/00* (2006.01)
*G01R 33/565* (2006.01)

(52) U.S. Cl.
CPC .......... *G06T 7/0014* (2013.01); *G01R 33/5659* (2013.01)

(58) Field of Classification Search
None
See application file for complete search history.

(56) References Cited

U.S. PATENT DOCUMENTS

| | | | |
|---|---|---|---|
| 7,532,214 B2* | 5/2009 | Lundstrom | 345/424 |
| 7,602,183 B2* | 10/2009 | Lustig et al. | 324/309 |
| 8,781,197 B2* | 7/2014 | Wang et al. | 382/131 |
| 2004/0097802 A1 | 5/2004 | Cohen | |
| 2008/0197842 A1* | 8/2008 | Lustig et al. | 324/307 |
| 2009/0141995 A1 | 6/2009 | Chakraborty et al. | |
| 2010/0207629 A1* | 8/2010 | Trzasko et al. | 324/309 |
| 2011/0044524 A1* | 2/2011 | Wang et al. | 382/131 |
| 2011/0058719 A1* | 3/2011 | Trzasko et al. | 382/131 |
| 2011/0116724 A1 | 5/2011 | Bilgin et al. | |
| 2011/0293158 A1 | 12/2011 | Popescu | |
| 2013/0310678 A1* | 11/2013 | Balbi et al. | 600/410 |

OTHER PUBLICATIONS

B. Wu, R. P. Millane, R. Watts and P. J. Bones "Prior estimate-based compressed sensing in parallel MRI" Magn. Reson. Med., vol. 65, No. 1, pp. 83-95, 2011.*

C. DeCarli, D.G.M. Murphy, D. Teichberg, G. Campbell, G.S. Sobering, "Local histogram correction of MRI spatially dependent image pixel intensity nonuniformity" J. Magn. Reson. Imag., 6 (1996), pp. 519-528.*

Y.-H. Kao and J. R. MacFall, "Correction of MR k-space data corrupted by spike noise", IEEE Trans. Med. Imag., vol. 19, pp. 671-680, 2000.*

(Continued)

*Primary Examiner* — Michael A Newman
*Assistant Examiner* — Soo Shin
(74) *Attorney, Agent, or Firm* — Nocak Druce Connolly Bove + Quigg LLP

(57) ABSTRACT

Systems and methods for processing magnetic resonance imaging (MRI) data are provided. A method includes receiving MRI data comprising a plurality of k-space points and deriving a plurality of image data sets based on the MRI data, each of the plurality of MRI image sets obtained by zeroing a different one of the plurality of k-space points. The method further includes computing image space metric values for each of the plurality of image data sets and adjusting a portion of the MRI data associated with ones of the image space metric values that fail to meet a threshold value to yield adjusted MRI data.

20 Claims, 13 Drawing Sheets

(56) References Cited

OTHER PUBLICATIONS

Atkinson et al., "Automatic correction of motion artifacts in magnetic resonance images using an entropy focus criterion", IEEE Transactions on Medical Imaging (1997) 16(6): 903-910.

Atkinson, "Incoherent artefact correction using PPI", NMR in Biomedicine (2006) 19(3): 362-367.

Berglund et al., "Three-point Dixon Method enables whole-body water and fat imaging of obese subjects", Mag Reson Med (2010) 63(6): 1659-1668.

Block et al., "Undersampled radial MRI with multiple coils. Iterative image reconstruction using a total variation constraint", Magnetic Resonance in Medicine (2007) 57: 1086-1098.

Brau et al., "Generalized self-navigation motion detection technique: Preliminary investigation in abdominal imaging", Magnetic Resonance in Medicine (2006) 55(2): 263-270.

Bydder et al., "Detection and elimination of motion artifacts by regeneration of k-space", Magnetic Resonance in Medicine (2002) 47(4): 677-686.

Candes, "Compressive sampling", Proc Intl Congress Mathematicians (2006) 17(4): 295-303.

Candes et al., "Robust uncertainty principles: Exact signal reconstruction from highly incomplete frequency information", IEEE Trans Inform Theory (2006) 52: 489-509.

Cevher et al., "Compressive sensing for background subtraction", Rice University (n.d.): 1-14.

Chavez et al., "Robust correction of spike noise: Application to diffusion tensor imaging", Magnetic Resonance in Medicine (2009) 62(2): 510-519.

Donoho, "Compressed sensing", IEEE Trans Inf Theory (2006) 52(4): 1289-1306.

Ehman et al., "Adaptive technique for high-definition MR imaging of moving structures", Radiology (1989) 173(1): 255-263.

Foo et al., "SNORE: Spike noise removal and detection", IEEE Trans Med Imag (1994) 13(1): 133-136.

Goldstein et al., "The split Bregman method for L1 regularized problems", SIAM J Imag Sci (2009) 2:323-343.

Kao et al., "Correction of MR kappaspace data corrupted by spike noise", IEEE Trans Med Imag (2000) 19(7): 671-680.

Larkman et al., "Artifact reduction using parallel imaging methods", Topics in Magnetic Resonance Imaging (2004) 15(4): 267-275.

Lustig et al., "Compressed sensing MRI", IEEE Sig Proc Mag (2008) 25(2): 72-82.

Lustig et al., "Sparse MRI: The application of compressed sensing for rapid MR imaging", Mag Reson Med (2007) 58: 1182-1195.

Manduca et al., "Autocorrection in MR imaging: Adaptive motion correction without navigator echoes", Radiology (2000) 215(3): 904-909.

McGee et al., "Image metric-based correction (autocorrection) of motion effects: Analysis of Image Metrics", Journal of Magnetic Resonance Imaging (2000) 11: 174-181.

Otsu, "A threshold selection method from gray-level histograms", IEEE Trans Systems, Man, and Cybernetics (1979) 9(1): 62-66.

Pipe, "Motion correction with Propeller MRI: Application to head motion and free-breathing cardiac imaging", Magnetic Resonance in Medicine (1999) 42(5): 963-969.

Staemmler et al., "Echo shape analysis and image size adjustment on the level of echoes: Improvement of parameter-selective proton images", Mag Reson Med (1986) 3(3): 418-424.

Welch et al., "Self-navigated motion correction using moments of spatial projections in radial MRI", Magnetic Resonance in Medicine (2004) 52(2): 337-345.

Zhang et al., "Elimination of k-space spikes in fMRI data", Mag Reson Imag (2001) 19(7): 1037-1041.

\* cited by examiner

200

300

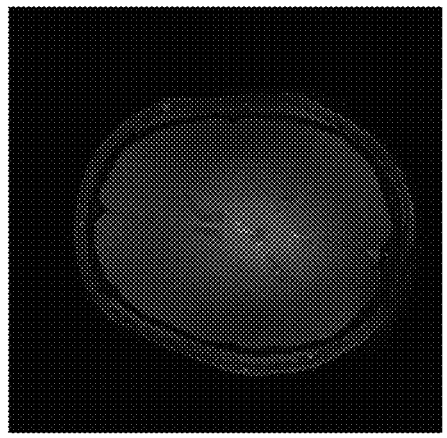
FIG. 8A
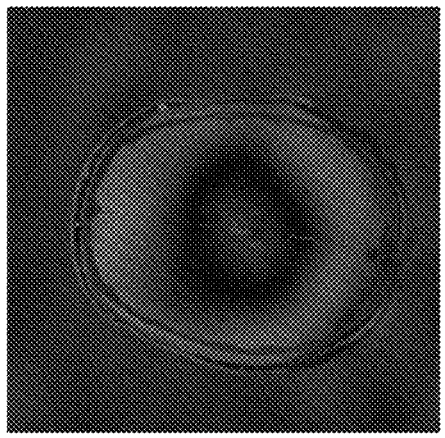
FIG. 8D
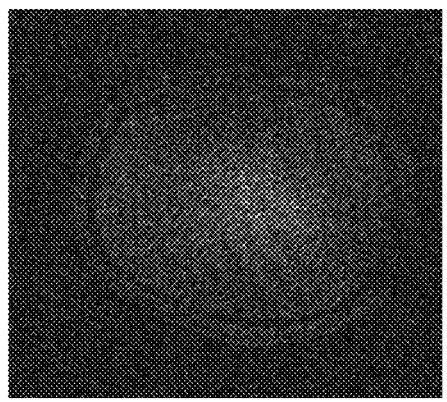
FIG. 8B
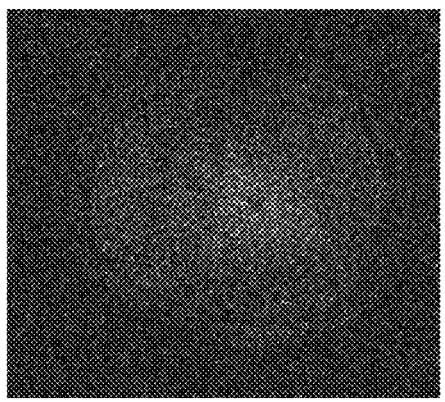
FIG. 8E
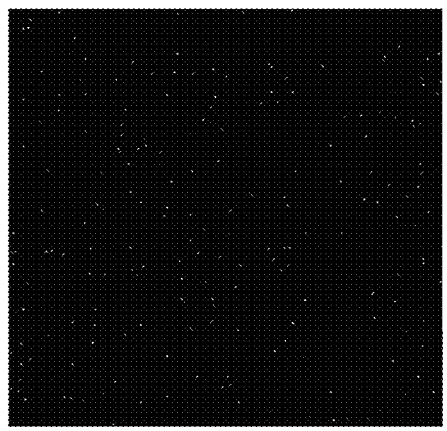
FIG. 8C
FIG. 8F

AUTOMATIC DETECTION AND CORRECTION OF MAGNETIC RESONANCE IMAGING DATA

CROSS-REFERENCE TO RELATED APPLICATIONS

This application claims the benefit of U.S. Provisional Application No. 61/607,683, entitled "Method to Automatically Detect and Correct Corrupted Magnetic Resonance Imaging Data", filed Mar. 7, 2012, the contents of which are herein incorporated by reference in their entirety.

GOVERNMENT LICENSE RIGHTS

This invention was made with government support under contract nos. NIBIB T32 EB001628, NCI R25CA092043, and NCATS ULI TR000445 awarded by the National Institutes of Health. The government has certain rights in the invention.

FIELD OF THE INVENTION

The present invention relates to magnetic resonance imaging (MRI), and more specifically to apparatus and methods for automated removal artifact in MRI data.

BACKGROUND

Radio frequency (RF) spike noise in magnetic resonance imaging (MRI) is defined as bursts of high amplitude corruptions in the Fourier domain (k-space) that cause Moiré patterns in the reconstructed image. Traditional spike correction techniques rely on the RF receive signal amplitude exceeding a certain present threshold in order to recognize spikes. Detected spikes are then typically replaced by zeros or by local interpolation of k-space neighbors.

Recent developments in compressed sensing have allowed the acquisition of MRI data with a significant relaxation of sampling requirements. In many cases, compressed sensing techniques can allow for reconstruction of full MRI data sets from just 25% or less of the full data set, as would be defined by the Nyquist-Shannon sampling theorem. RF spike noise is typically limited to less than 1% of the k-space data, so reconstructing the correct data in place of the spiked data should be trivial for a method as effective as compressed sensing.

SUMMARY

Embodiments of the invention concern systems and methods for processing magnetic resonance imaging (MRI) data. In a first embodiment of the invention, a method for processing MRI data is provided. The method includes receiving MRI data comprising a plurality of k-space points and deriving a plurality of image data sets based on the MRI data, each of the plurality of MRI image sets obtained by zeroing a different one of the plurality of k-space points. The method also includes computing image space metric values for each of the plurality of image data sets and adjusting a portion of the MRI data associated with ones of the image space metric values that fail to meet a threshold value to yield adjusted MRI data. The method can also include generating a final image from the adjusted MRI data.

In a second embodiment of the invention, a system for processing MRI data is provided. The system includes a processor and a computer-readable medium comprising a plurality of instructions for causing the processor to perform a method. The method includes receiving MRI data comprising a plurality of k-space points and deriving a plurality of image data sets based on the MRI data, each of the plurality of MRI image sets obtained by zeroing a different one of the plurality of k-space points. The method also includes computing image space metric values for each of the plurality of image data sets and adjusting a portion of the MRI data associated with ones of the image space metric values that fail to meet a threshold value to yield adjusted MRI data. The method can also include generating a final image from the adjusted MRI data.

In a third embodiment of the invention, a computer-readable medium is provided, having stored thereon a plurality of instructions for causing a computing device to perform a method for processing MRI data. In the computer-readable medium, the plurality of instructions include code sections for receiving MRI data comprising a plurality of k-space points, deriving a plurality of image data sets based on the MRI data, each of the plurality of MRI image sets obtained by zeroing a different one of the plurality of k-space points, computing image space metric values for each of the plurality of image data sets, and adjusting a portion of the MRI data associated with ones of the image space metric values that fail to meet a threshold value to yield adjusted MRI data.

In the various embodiments, the adjusting can consist of setting values of each of the k-space points in the portion of the MRI data to zero. Alternatively, the adjusting can consist of computing new values of each of the k-space points in the portion of the MRI data using a constrained reconstruction. The constrained reconstruction can be a compressed sensing (CS) reconstruction.

In the various embodiments, the adjusting can further include identifying the portion of the MRI data by sorting the image space metric values to yield sorted image space metric values, defining a function of the sorted image space metric values as a function of the logarithm of sorted position, selecting a critical image space metric value associated with the shoulder of the function closest to the median as the threshold. and selecting as the portion of the MRI data, at least a portion of the sorted image space metric below the threshold. The defining of the function can include reversing sorted image space metric values; and discarding values greater than the median.

Alternatively, the adjusting can include defining the threshold value by discarding an upper half of the image space metric values to yield remaining image space metric values, computing a class threshold for the remaining image space metric values, and selecting as the portion of the MRI data, at least a portion of the sorted image space metric below the class threshold.

In the various embodiments, the image space metric values can be total variation values.

BRIEF DESCRIPTION OF THE DRAWINGS

FIGS. 8A-8F show the spike locations (FIGS. 8A and 8D), corrupted images (FIGS. 8B and 8E), and cleaned images according to an embodiment of the invention (FIGS. 8C and 8F) for two different cases;

Figure 12:
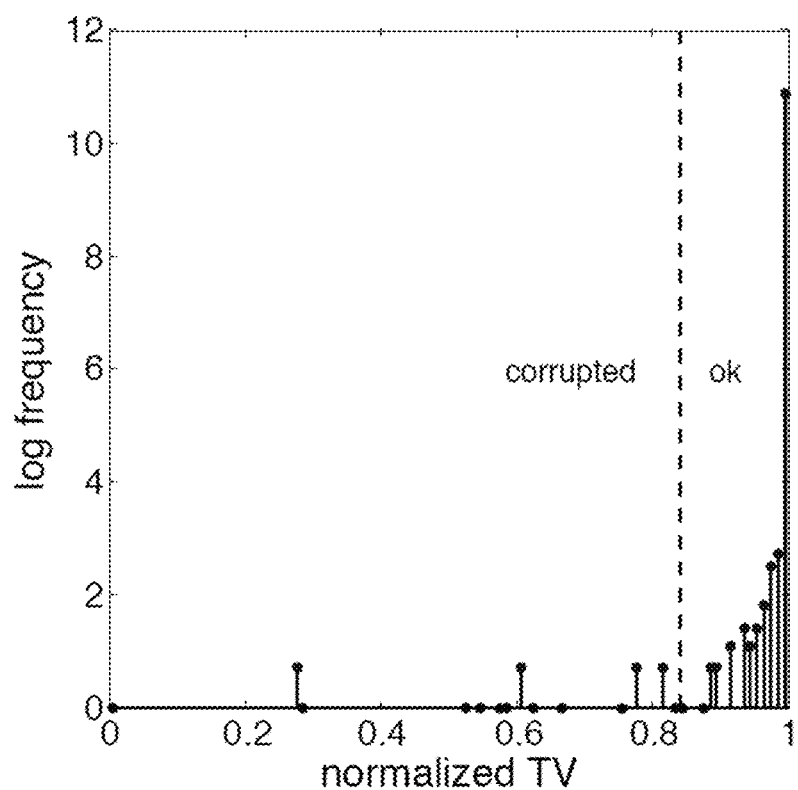
FIG. 12 shows a histogram of normalized total variation in accordance with an embodiment of the invention for corrupted fat-water imaging data.

The histogram of TV values produced is shown in FIG. 12

FIGS. 13A-13F show the performance of an algorithm in accordance with the various embodiments for an unknown number of spikes in real data acquired with a faulty RF room shield during a whole-body gradient echo scan for fat-water imaging.

DETAILED DESCRIPTION

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

In view of the foregoing, the various embodiments of the invention are directed to method of preparing MRI data, including RF spikes and/or other artifacts, for reconstruction. In particular, the various embodiments are directed to an automated data post-processing technique that detects and eliminates RF spikes (or similar artifacts) and creates a "clean" raw MRI data set for a standard or custom reconstruction pipeline, such as a CS reconstruction. The method presented here is extremely compatible with a reconstruction post-processing pipeline that works with little or no user intervention to clean up data and monitor hardware function. With appropriate use of spike detection and correction methods, discarding a data set due to spiking artifacts should be almost always unnecessary.

Figure 1A:
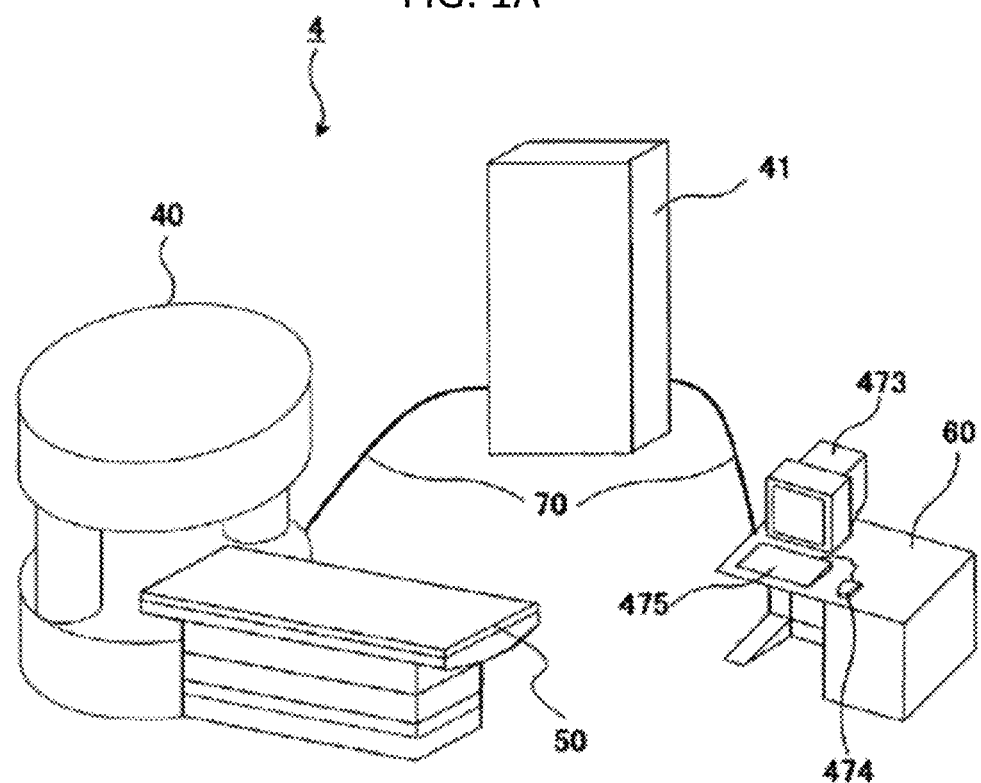
FIG. 1A is a structural diagram showing an MRI apparatus in accordance with the various embodiments.
Figure 1B:
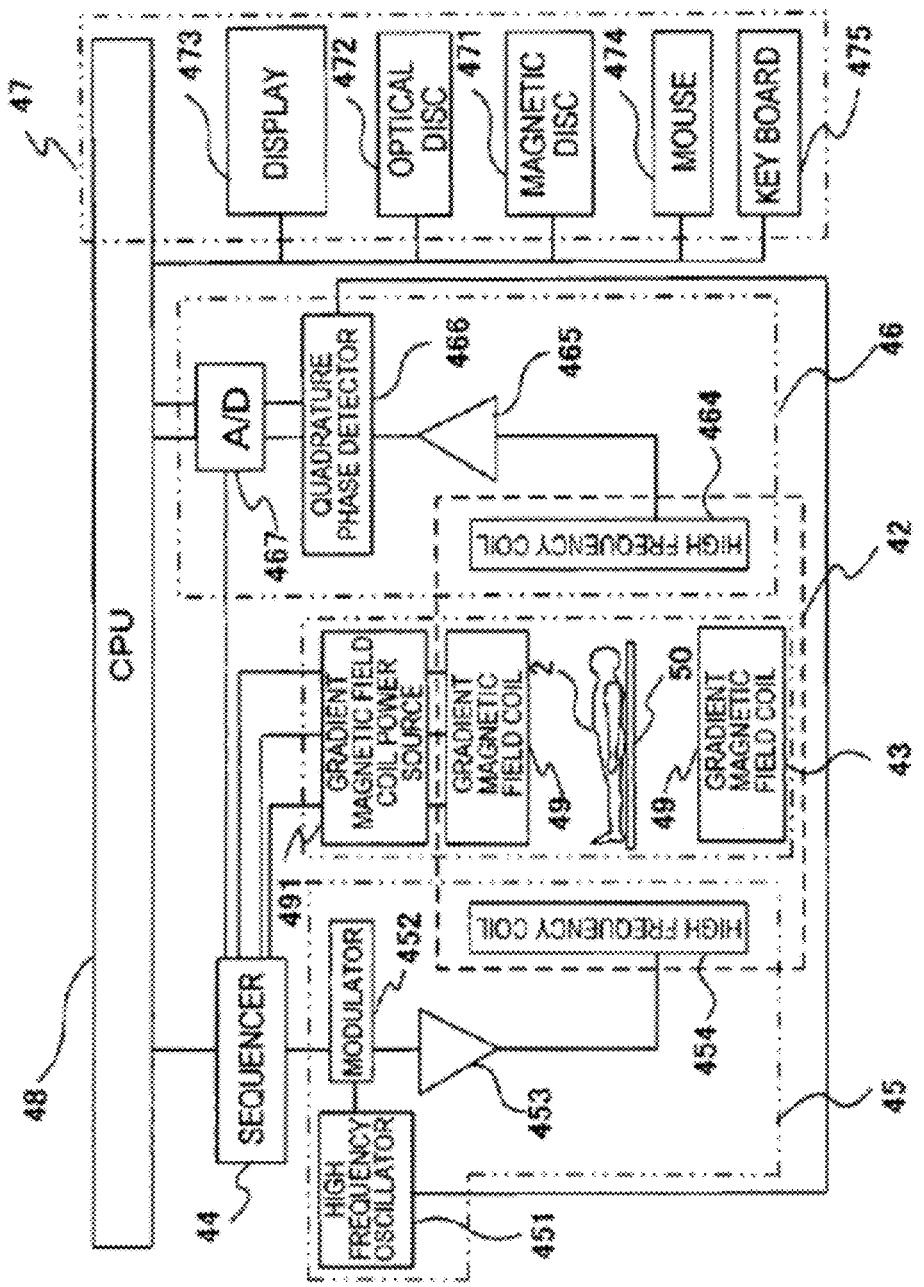
FIG. 1B is a block diagram to show the interior of the MRI apparatus in FIG. 1A.

Turning first to FIGS. 1A and 1B, an MRI apparatus configured for carrying out the various embodiments of the invention will be described. FIG. 1A is a structural diagram showing an MRI apparatus in accordance with the various embodiments, and FIG. 1B is a block diagram to show the interior of the MRI apparatus in FIG. 1A.

The MRI apparatus 4 of FIG. 1A is of a perpendicular magnetic field type (open type), but may be of any other type such as a tunnel type. In the MRI apparatus 4, an oscillating magnetic field (electromagnetic waves) is applied to a subject arranged in static magnetic fields to induce nuclear magnetic resonance (NMR). A detecting coil (RF coil) detects resonance signals as electrical signals; thereby the signals are reconstructed as projected data to produce an image of the interior of the subject 2 noninvasively.

The MRI apparatus 4 comprises a gantry 40, a house 41 in which a power source to drive various devices in the gantry 40 and various control devices to control are stored, a bed 50 on which the above subject 2 is rested, and a processing unit 60 which processes the received NMR signals to reconstruct a tomogram image of the subject 2. The gantry 40 and the house 41 are connected by a power source/signal line 70. Similarly, the processing unit 60 and the house 41 are connected by a power source/signal line 70.

The gantry 40 and the bed 50 are placed in a shield room to shield high frequency electromagnetic waves and static magnetic fields (not shown). The house 41 and the processing unit 60 are placed outside of the shield room.

Next, referring to FIG. 1B, the structure of an exemplary MRI apparatus 4 for carrying out the various embodiments of the invention will be explained in more detail. The MRI apparatus 4 includes a static magnetic field generating system 42, a magnetic field gradient generating system 43, a sequencer 44, a transmitting system 45, a receiving system 46, a signal processing system 47 including an operating section, and a central processing unit (CPU) 48.

The static magnetic field generating system 42 generates a uniform static magnetic field around the subject 2 in a direction of the body axis of the subject 2 or in a direction orthogonal to the body axis of the subject 2. The static magnetic field generating system 42 comprises permanent magnet type, resistive type or superconductive type magnetic field generating means placed in the extended space around the subject 2.

The magnetic field gradient generating system 43 comprises two gradient magnetic field coils 49 which are wound in the three X, Y and Z axis directions, and a gradient magnetic field power source 491 to drive each gradient magnetic field coils 49. When the gradient magnetic field coil power source 491 for each gradient magnetic field coils 49 is driven by a command from the sequencer 44, gradient magnetic fields $G_X$, $G_Y$, and $G_Z$ in the three X, Y and Z axis directions are applied to the subject 2. The way to apply the gradient magnetic fields sets a slice plane relative to the subject 2.

The sequencer 44 repeatedly applies high frequency magnetic field pulses which cause the atomic nucleus of an atom that produces a living tissue of the subject 2 to induce nuclear magnetic resonance, in a predetermined pulse sequence, as described in greater detail below. The sequencer 44 is controlled to operate by the CPU 48, and sends various commands required to collect data of tomogram images of the subject 2 to the transmitting system 45, the magnetic field gradient generating system 43, and a receiving system 46.

The transmitting system 45 irradiates a high frequency magnetic field which causes the atomic nucleus of an atom that produces a living tissue of the subject 2 to induce nuclear magnetic resonance with a high frequency pulses emitted from the sequencer 44. The transmitting system 45 includes a high frequency oscillator 451, a modulator 452, a high frequency amplifier 453, and a high frequency coil 454 for transmitting. The high frequency pulses emitted from the high frequency oscillator 451 are amplitude modulated by the modulator 452 according to the command from the sequencer 44. After the amplitude modulated high frequency pulses are amplified by the high frequency amplifier 453, the pulses are supplied to the high frequency coil 454 positioned close to the subject 2. In this way, an electromagnetic wave is irradiated to the subject 2.

The receiving system 46 detects an echo signal (NMR signal) emitted by the nuclear magnetic resonance in atomic nucleus of the living tissue of the subject 2. The receiving system 46 comprises a high frequency coil 464 for receiving, an amplifier 465, a quadrature phase detector 466, and an A/D converter 467. The electromagnetic wave (NMR signal) from the subject 2 in response to the electromagnetic waves emitted from the high frequency coil 454 for transmitting is detected by the high frequency coil 464 positioned close to the subject 2. The detected NMR signal is input into the A/D converter 467 via the amplifier 465 and the quadrature phase detector 466 to be converted into a digital signal. The quadrature phase detector 466 converts the detected NMR signal into biserial data collected by sampling at timings specified by the command from the sequencer 44. The collected data is transmitted to the signal processing system 47.

The signal processing system 47 includes a CPU 48, a recording device such as a magnetic disc 471 and an optical disc 472, a display 473 such as a CRT, a pointing device and its controller such as a mouse 474, and an input unit such as a key board 475. The CPU 48 performs a Fourier transform operation and an operation of correction coefficient calculation for image reconstruction, and performs appropriate operations based on a signal strength distribution or a plurality of signals of any section to obtain a distribution to create an image, thereby generates a tomogram. The display 473 displays the tomogram.

Such a MRI apparatus 4 with the recent increased performance produces a high magnetic field (e.g. 1.5 T or greater) apparatus, which allows four dimensional image data to be obtained with noise of a practical level and high time resolution.

Although FIGS. 1A and 1B describe an exemplary MRI system including a specific set and arrangement of components, this is solely for illustrative purposes and the various embodiments are not limited in this regard. Rather, an MRI system configured in accordance with the various embodiments can have more or less components as illustrated in FIGS. 1A and 1B. Further, the arrangement of such components of an MRI system can be the same or different as that described with respect to FIGS. 1A and 1B.

Now that an exemplary environment has been described for utilizing the various embodiments of the invention, the disclosure now turns to the method of the various embodiments for the identification of points to define as artifacts to be removed.

In the various embodiments, RF spikes are defined as the n points in k-space with the largest minimum slope to their neighbors. Thereafter, a mask is generated that omits the n spikes. In some embodiments, the spike points can then be replaced in a total variation (TV) regularized CS MRI reconstruction. In other embodiments, the spike points can be replaced with zeros. In many embodiments, the number of spikes can be detected based on the definition above. However, the various embodiments are not limited in this regard. Rather, the number of spikes to be replaced can be specified a priori. As noted above, as CS reconstruction is fairly tolerant with respect to the amount of corrupted data it can manage, specifying too many spikes does not necessarily affect the CS reconstruction. Over identification can actually help in some cases, since spikes are more likely to be correctly labeled.

Although the various embodiments will be described with respect to TV data, the various embodiments are not limited in this regard. In other embodiments, other image space metric values can be utilized in substantially the same manner. These include, but are not limited to those listed in Table 1 by Kiaran P. McGee et al. in "Image Metric-Based Correction (Autocorrection) of Motion Effects: Analysis of Image Metrics", JOURNAL OF MAGNETIC RESONANCE IMAGING, 11:174-181 (2000), the contents of which are herein incorporated by reference in their entirety. Further, although the various embodiments will be described with respect to a CS reconstruction, any other type of constrained reconstruction can be used in the various embodiments.

During collection of the data at an MRI scanner, a physical target object is encoded by variable spatial frequencies that are then interpreted as the coefficients of the discrete Fourier transform (DFT) of the target. Perturbing a single Fourier coefficient in k-space will lead to global sinusoidal intensity variations in the image. The coefficients of the DFT are the coefficients which minimize the approximation error of the imaging target. Since anatomical structures are typically smooth objects on a flat (signal free) background, finding the coefficients that are causing the most "rippling" in the image should point to corrupted data. Furthermore, all coefficients are corrupted at some level due to noise, so we would like to distinguish a point of diminishing returns, beyond which we are replacing valid, but noisy, data. The optimal image improvement should result when only data corrupted by RF spikes are replaced and all valid points are retained. The general steps in the method follow and illustrated in FIG. 2.

Figure 2:
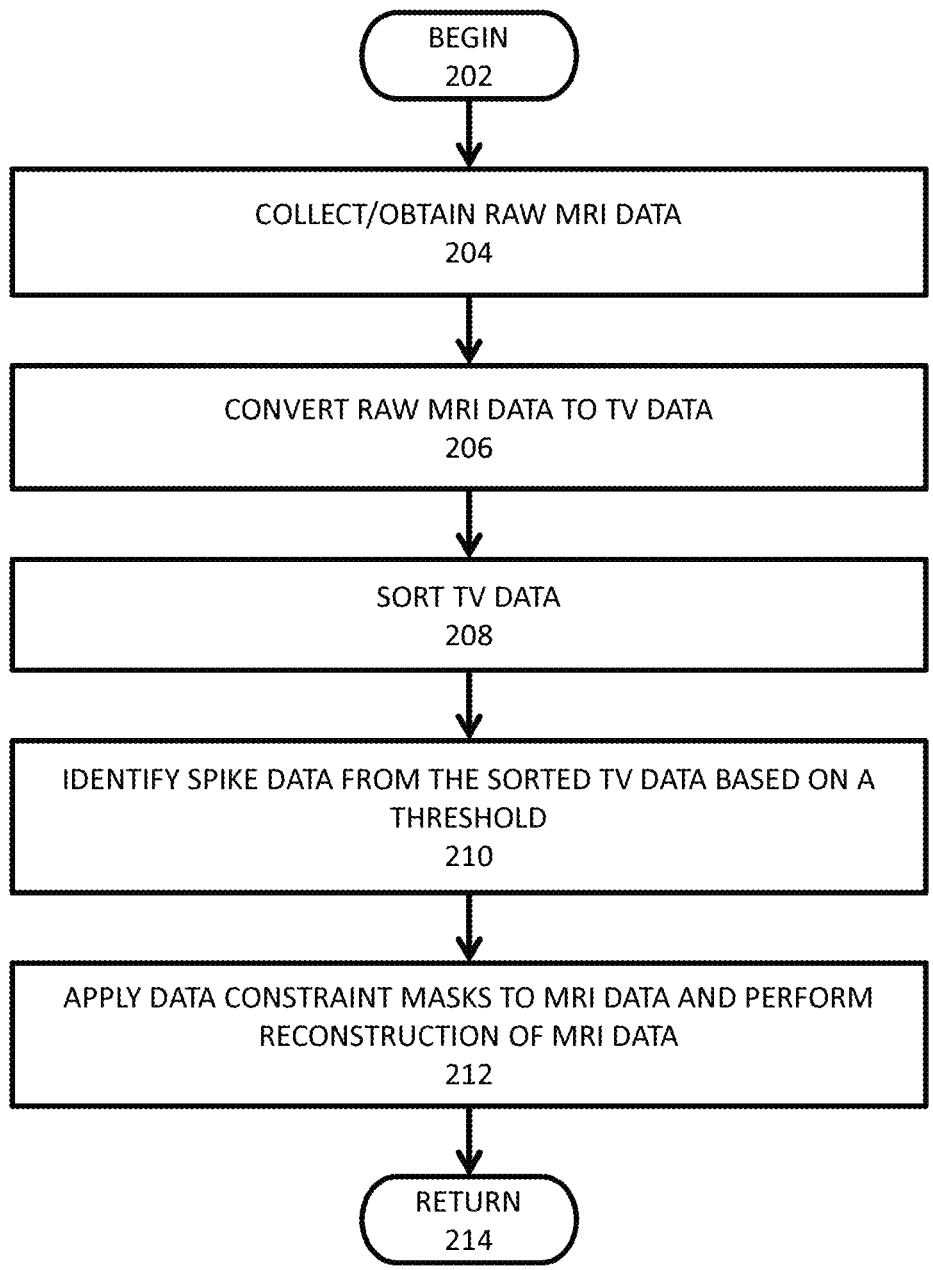
FIG. 2 is a flowchart of steps in an exemplary method for generating MRI images in accordance with an embodiment of the invention.

FIG. 2 is a flowchart of steps in one exemplary method 200 for generating MRI images in accordance with an embodiment of the invention. The method can begin at step 202 and proceeds to step 204. At step 204, raw MRI data is collected. The MRI data can include a plurality of k-space points.

Thereafter convert the raw MRI data to TV data at step 206. In step 206, one can define the collected data (d), or k-space, of a complex valued image x as d=Fx, where F is the discrete Fourier transform. For detection of spikes, each point of d was in turn zeroed, leading to a corresponding derived image $x^k$:

$$x^k = \mathcal{F}^{-1} I^k d, \quad (1)$$

where $I^k$ is the identity matrix with the k-th element along the diagonal set to zero. Thus a plurality image sets $x^k$ is derived from the MRI data to derive a vector of aggregated TV values t, where the k-th element of t (was computed as the TV of the derived image $x^k$:

$$t_k = TV(x^k) = \sum_{s=1}^{N} \|\nabla_s x^k\|_1, \quad (2)$$

Wherein N is the total number of data points, where $\nabla_s$ is the forward difference along the dimension s (e.g., s={1, 2, 3} for a 3-D protocol) and $\|\cdot\|_1$ is the $l_1$-norm, defined for a vector v as $\|v\|_1 = \Sigma_i |v_i|$ Once the TV data is generated at step 206, the TV values of t are then sorted at step 208 from smallest to largest. The sorted TV values are then used at step 210 to identify RF spikes.

At step 210, the identification of RF spikes is performed via use of a threshold. The threshold is used to separate the k-space points that, when deleted, create the lowest TV from those that had little effect on the TV. This is a critical step in identifying spikes. In the various embodiments, this threshold is specified as a minimum slope on the graph of dTV=d log k. Unfortunately, in anatomical images, MRI data can result in multiple "shoulders" in a graph of TV vs. log position. Accordingly, selecting a shoulder randomly can result in a large number of RF spikes remaining in the MRI data. Therefore, in order to ensure that substantially all spikes in such MRI data are detected and removed, step 210 encompasses additional processing for performing the identification of RF spikes. In particular, the sorted TV data is first reversed. That is, the sorted TV dataset is ordered smallest to largest in magnitude. Thereafter, the TV values greater than the median TV value are discarded. The shoulder is then identified as the first point of the remaining data in which the slope of the sorted TV-position curve was greater than the tangent of the cutoff angle θ. The cutoff angle θ can be between 1 and 5 degrees. All points in with slopes greater than that of the first point are then identified as spikes.

After the spikes are identified at step 210, these suspected spikes are discarded at step 212 to create a data constraint mask M for the reconstruction:

$$M = \Pi_{\hat{k}} j^k, \quad (3)$$

where $\hat{k} \in \{k : t_k < \sqrt{\theta}\}$. Thereafter, at step 212, the data constraint mask can be applied to the MRI data to discard the spike data and the remaining MRI data can be used to carry out the reconstruction and generate an image. The method 200 can then proceed to step 214 to resume previous processing, including repeating method 200 for other MRI data sets. The spike detection algorithm is summarized in Algorithm 1.

---

Algorithm 1 :: Spike Detection

---

Require: input data d, threshold angle θ
  t ← 0
  for all k do
    g ← d
    $g_k$ ← 0
    $t_k$ ← TV($\mathcal{F}^{-1}$g)
  end for
  Normalize t to lie on [0, 1] interval.
  Sort t in ascending order.
  Smooth t.
  for k = 1 to n − 1 do
    $m_k$ ← $(t_{k+1} - t_k)$/log(1 + 1/k)
  end for
  Reverse m.
  Truncate m at middle element.
  for all k do
    if $m_k$ > tanθ then
      All k > j are labeled as spikes.
      return
    end if
  end for

---

As noted above, images cleaned of spikes can be then reconstructed using an unconstrained TV-regularized compressed sensing reconstruction. In some embodiments, the unconstrained TV-regularized compressed sensing reconstruction can be of the form:

$$x_{clean} = \underset{x}{\operatorname{argmin}} TV(x) + \frac{\lambda}{2} \|MFx - Md\|_2^2, \quad (4)$$

where λ is a scalar weighting factor that controls the balance between promoting sparsity of the gradient image and fidelity to the measured data. Various solvers can be utilized in the various embodiments. In one exemplary embodiment in which only Cartesian data is available, a fast split Bregman solver can be used for the reconstruction. Other solvers include projection onto convex sets (POCS), conjugate gradient (CG), and alternative direction methods (ADM). However, the various embodiments are not limited to any particular method and any other reconstruction methods based on TV data can be used in the various embodiments.

The literature of compressed sensing MRI frequently refers to the requirement that image artifacts due to the random sampling be "incoherent," but this is technically incorrect. What should be incoherent is the measurement basis and the sparse basis, in this case, the image gradient and the Fourier measurement. This allows the sparse basis to maximally constrain the data in the measurement domain, effectively turning a global effect into perfectly localized information. In fact, in the case of RF spike noise with one spike, the image artifact will be extremely coherent, consisting of just one frequency, but TV minimization works extraordinarily well to eliminate it because a single error in k-space produces a global effect on the gradient image.

The TV minimization spike detection methodology of the various embodiments is robust and flexible, but can be modified in the various embodiments to increase accuracy and sensitivity. For example, inconsistencies across multi-channel or dynamic data could be added to detection criteria in some embodiments to increase accuracy, perhaps by comparing the variance of k-space points across time or channel. In other embodiments, the k-space points could be compared pairwise, instead of individually. As the number of spikes increases, it becomes increasingly likely that one or more spikes will interfere with each other, producing a lower TV together than each would alone. This might cause the TV to actually increase when one spike is deleted during the detection algorithm. Accordingly in some embodiments, each combination of pairs of k-space points can be deleted and the algorithm can be performed with two missing k-space locations to improve detection might. The computational penalty for this would be large, however. That is, instead of a number of fast Fourier transforms equal to the data size, one would compute a number equal to the data size squared.

Although the method described in Algorithm 1 and FIG. 2 can be utilized to provide satisfactory results, there are several deficiencies in the methodology. Specifically, with respect to the methodology for selecting points to be discarded. First, for some types of data, multiple shoulders may appear in the plot of sorted position versus total variation. Accordingly, this may result in insufficient points being discarded or too many points being discarded. Although CS reconstruction can generally manage with a large amount of missing points, this can still result in the discarding of points including significant data. Second, the overall methodology is relatively complex, as evidenced by Algorithm 1.

In the of the deficiencies of the method of FIG. 2 and Algorithm 1, an alternate methodology for selecting and discarding points is provided in other embodiments of the invention. This is discussed below with respect to FIG. 3.

Figure 3:
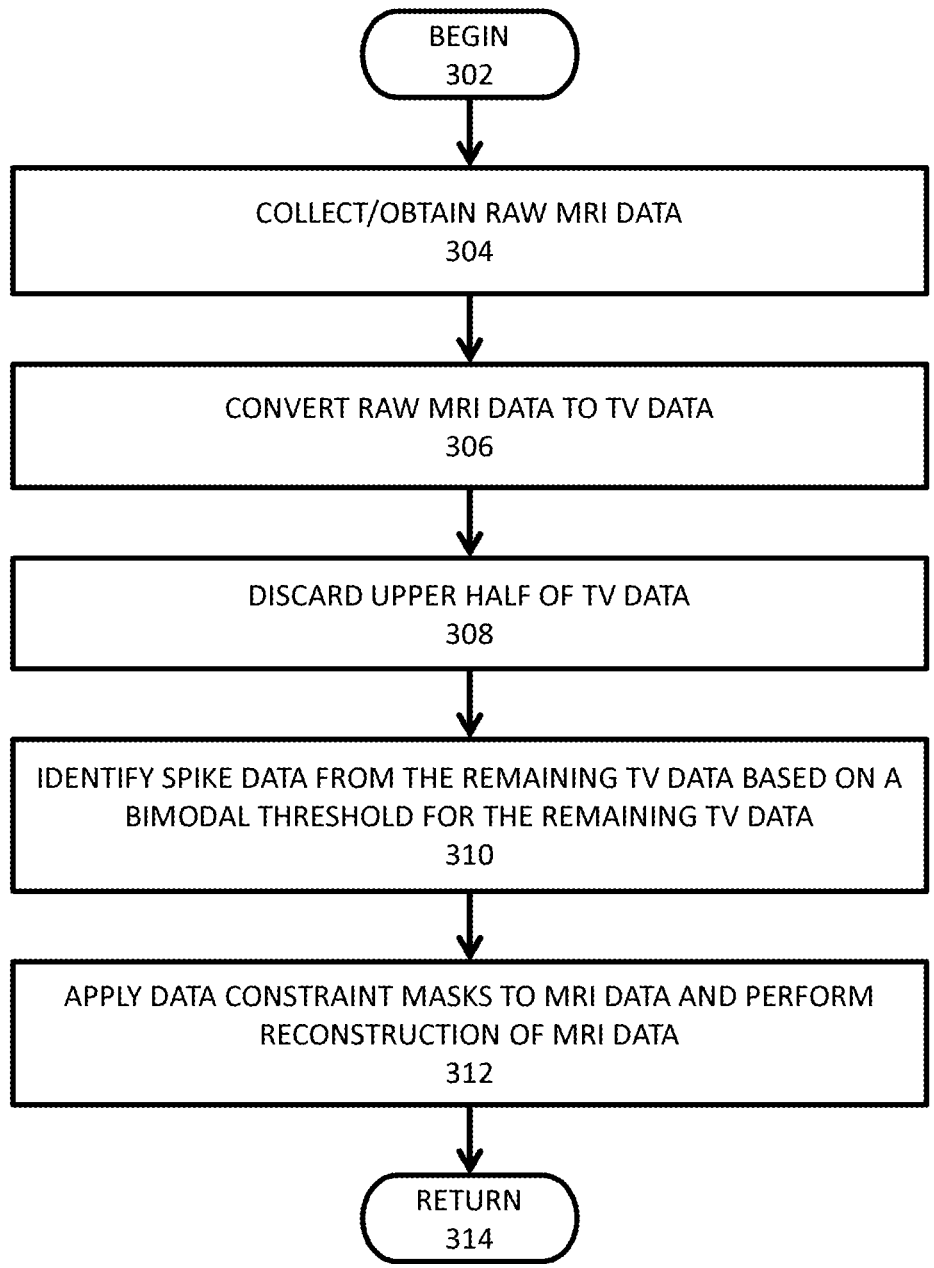
FIG. 3 is a flowchart of steps in an alternate exemplary method for generating MRI images in accordance with an embodiment of the invention.

FIG. 3 is a flowchart of steps in an alternate exemplary method 300 for generating MRI images in accordance with the various embodiments of the invention. Method 300 begins at step 302 and proceeds to steps 304 and 306, where raw MRI data is collected and is converted to TV data, as described above for FIG. 2 with respect to steps 204 and 206 of method 200.

In method 300, once the TV data is obtained at step 306, the upper half of the TV data can be assumed to be valid and can be discarded at step 308, since these points can be assumed to have the least effect on image total variation. The upper and lower halfs are identified by calculating the median of the TV data and selecting as the upper half at least the points in the TV data with a magnitude greater than the median. In some embodiments, the mean can be utilized, however, this may result in an insufficient number of points being discarded and can require additional analysis. In some embodiments, to simplify subsequent computation and analysis, step 308 can also include normalizing the remaining TV data to lie between 0 and 1.

Once the remaining TV data is identified and, if necessary, normalized, the method can proceed to step 310 to identify the spike data. In particular, step 310 includes obtaining a class threshold θ for the remaining TV data that separates the TV data into two classes so that the in-class variance is minimized or the in-class similarity is maximized. In some embodiments, the threshold θ can be selected using Otsu's method, as described in "A threshold selection method from gray-level histograms," IEEE Trans. Systems, Man, and Cybernetics, vol. 9, no. 1, pp. 62-66, 1979, the contents of which are herein incorporated by reference in their entirety. However, the various embodiments are not limited in this regard. Rather, any other thresholding techniques can be utilized to obtain the threshold θ. For example, a histogram shape-based or graphical method can be used. That is, the threshold can be selected based on the peaks, valleys and curvatures of the histogram. In the case of bimodal distribution for the remaining TV data, the class threshold would be associated with a valley in the histogram. Other methods that are equally applicable include, but are not limited to, clustering-based methods, entropy-based methods, object-attribute-based methods, spatial methods, and local methods.

As noted above, the mean value can be selected to identify the points to be discarded. However, in such cases, the remaining data may include a large number of points and may define additional peaks and valley in the histogram. In such embodiments, identifying a class threshold via Otsu's method may still be effective. Alternative, the local minima in the histogram can be identified and the smallest local minima can be used to identify the threshold for those points associated with the spike data.

In some embodiments, the threshold θ could be directly used at step 310 to identify spike data. That is, all t<θ can be assumed to be spikes and can be discarded. However, it is worth noting that (1) the penalty in terms of image quality is more severe when corrupted data is missed than when clean data is thought to be corrupted and (2) the CS reconstruction is fairly tolerant to large amounts of missing data. Accordingly, in some embodiments the cutoff between corrupted and clean data can be increased to $\sqrt{\theta}$ when the TV values have been normalized to be between zero and one. That is, all $t<\sqrt{\theta}$ can be assumed to be spikes and discarded. This approach provides a more aggressive selection of spiked data and, as discussed in further detail below, provides a robust and highly accurate method.

Once the suspected spikes were identified and discarded at step 310, the method 300 can proceed to step 312 to create a data constraint mask M for the reconstruction in equation 3, similar to step 212 in method 200. The method 300 can then resume previous processing at step 314, including repeating method 300. The spike detection algorithm of method 300 (relying on a threshold of $\sqrt{\theta}$ and Otsu's method) is summarized in Algorithm 2.

---

Algorithm 2 :: Alternate Spike Detection

---

Require: input data d
   for all data points k do
      g ← d
      $g_k$ ← 0
      $t_k$ ← TV($\mathcal{F}^{-1}$g)
   end for
   Discard upper half of t.
   Normalize remaining t to lie on [0, 1] interval.
   Calculate Otsu threshold θ for t.
   All $t<\sqrt{\theta}$ are labeled as assumed spikes.
   return

---

Algorithm 2 and the method of FIG. 3 thus provides methods for detecting and eliminating radio frequency spikes in MRI data that are automated, robust, and extremely accurate. This method achieves markedly improved images derived fat and water images. In particular, the success of the technique on both synthetic corrupted data with known spikes and on whole-body gradient echo data corrupted by real RF spike noise is illustrated below.

The most significant contribution of algorithm described here, particularly Algorithm 2, is the ability to detect corrupted k-space locations without human intervention. Whatever the source of error, k-space data that is inconsistent will typically produce a large effect on the image total variation. Thus this feature that can be exploited to clean images by filtering out corrupted k-space data. Humans are excellent pattern recognizers, but requiring human intervention is slow and expensive. While Fourier coefficient thresholding certainly works in many cases, it is easy to identify examples in which the spikes do not cross the threshold or where the assumptions about the falloff of complex coefficients at high spatial frequencies are incorrect. In fact, the real spike experiments discussed below demonstrate that an MRI scanner's commercial built-in algorithm, that uses Fourier amplitude thresholding, misses many spikes.

Further, the algorithms described herein do not blur or excessively smooth the image, as can occur with TV-based denoising. That is, since there is only undersampling of the image by a very small amount in k-space, the data constraint is enforced in the Fourier domain, and the methods herein are not affecting the image as much as image domain techniques like TV denoising. In fact, the amount of data altered here is so slight that generally only sinusoidal ripples would be removed. Thus, other features in the image, such as background Rician noise in the magnitude image, would be left intact.

It should be noted the various embodiments are not limited to the structure of Algorithm 1 or Algorithm 2. Rather, many improvements can be added to increase the accuracy and sensitivity of these algorithms.

For example, inconsistencies across multiple receive coil channels or dynamic acquisitions could supplement detection criteria to increase accuracy, perhaps by comparing the variance of k-space points across time or coil. Most functional MRI and diffusion tensor imaging studies acquire dozens or hundreds of sequential dynamic images with echoplanar readouts that are demanding of gradient hardware and that can frequently cause spiking. The advantage of the large number of dynamics acquired in these studies is that each k-space location is acquired many times, allowing temporal correlations and statistical methods to be added to the basic TV method presented here. Presumably, the spike distribution would be broader with a higher mean in the histogram of temporal variances for each point. Therefore, in the case of Algorithm 2, Otsu's method (or other similar methods for obtaining a class threshold) could determine a separation threshold based on such criteria instead of the TV value alone, or perhaps both could be included in the categorization criteria.

In another example, contiguous data samples instead of single k-space points could be deleted. Because spike occurrence is a temporal phenomenon and k-space is traversed through time, portions of k-space larger than a single point may be corrupted by a single RF event. This can be observed in k-space data as bright spikes that are clustered and that trail along the vertical (readout) axis. This can be exploited to improve detection accuracy.

In still another example, if k-space locations were considered in pairs or larger groups, as well as in isolation, the detection might be improved. The computational penalty for this would be large, however, since each comparison requires a full 2D or 3D fast Fourier transform.

In yet another example, different data corruption models can be considered and this approach can be extended to address motion, Nyquist ghosting, and pulsatile artifacts, to name a few. That is, scenarios in which entire readout lines are corrupted or have a systematic error. In these cases, the image TV can constrain the replacement of entire readout lines or help constrain empirical fits in parametric models, such as in the case of gradient delay estimation. Methods to detect and compensate for artifacts caused by such k-space corruption include, but are not limited to, dedicated navigator echoes, self-navigation, iterative autofocusing, and methods based on the data redundancy afforded by multi-channel receive coils.

EXAMPLES

The following examples and results are presented solely for illustrating the various embodiments and are not intended to limit the various embodiments in any way.

In a first study, the techniques described above with respect to Algorithm 1 and FIG. 2 were evaluated. The result of this evaluation resulted in detection of both synthetic spikes and real spikes with a high degree of accuracy. Further, even when the techniques of the various embodiments failed to detect all spikes, it detected a large fraction, leading to substantial improvement in image quality.

In this evaluation, the TV minimization detection algorithm of Algorithm 1 and FIG. 2 was first applied to a custom noiseless phantoms designed to be difficult to reconstruct with standard compressed sensing methods.

Figure 4:
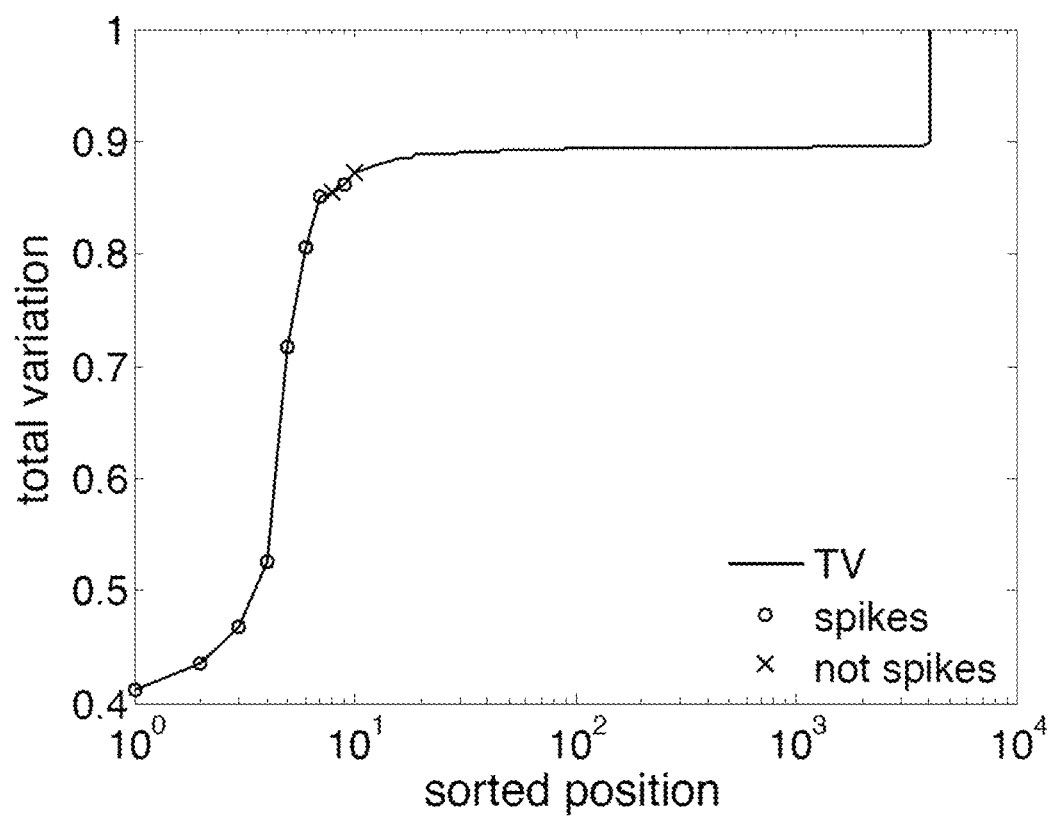
FIG. 4 shows exemplary sorted TV values produced by deleting each k-space point for the synthetically spiked phantom.

FIG. 4 shows the sorted TV values produced by deleting each k-space point for the synthetically spiked phantom. In particular, FIG. 4 shows the sorted TV values produced by deleting each k-space point in the synthetic phantom example. Point markers denote points labeled as spikes by our detection algorithm. The "o" symbols show the actual spikes inserted, while the "x" symbols show valid data incorrectly labeled as spikes. One can see that the actual spikes (denoted by circles) were almost entirely to the left of the "shoulder" in FIG. 4, showing the effectiveness of this metric. The effect on k-space and the image is shown in FIGS. 5A-5D.

Figure 5A:
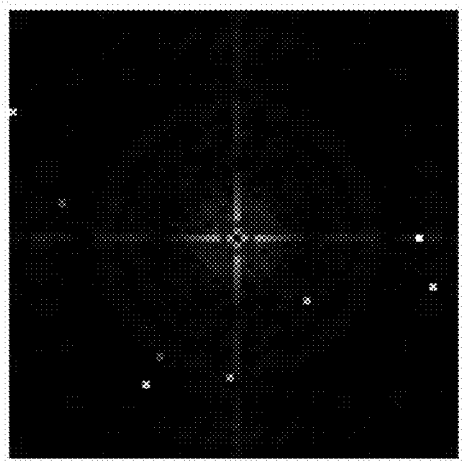
FIGS. 5A-5D shows examples of performance an algorithm in accordance with the various embodiments with eight known spikes added to a 64×64 noise-free phantom.
Figure 5B:
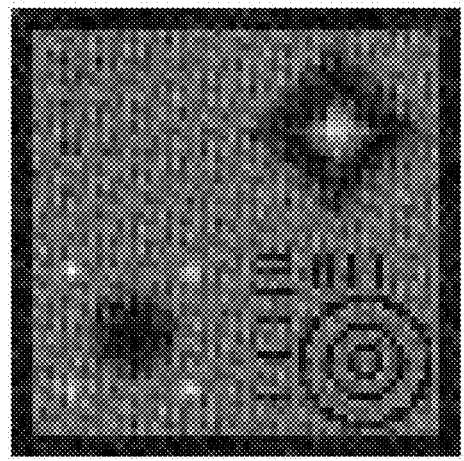
Figure 5C:
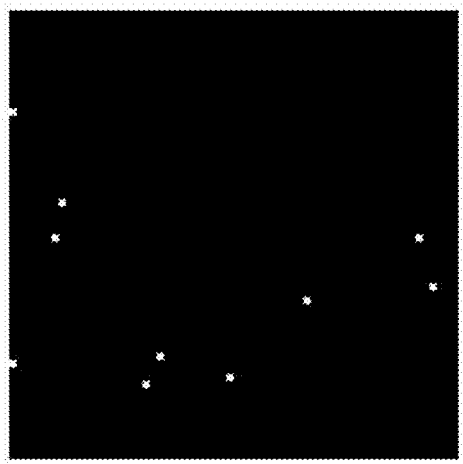
Figure 5D:
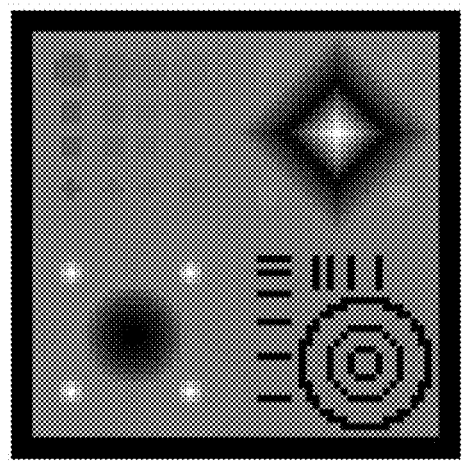
Figures 6A, 6B, 6C:
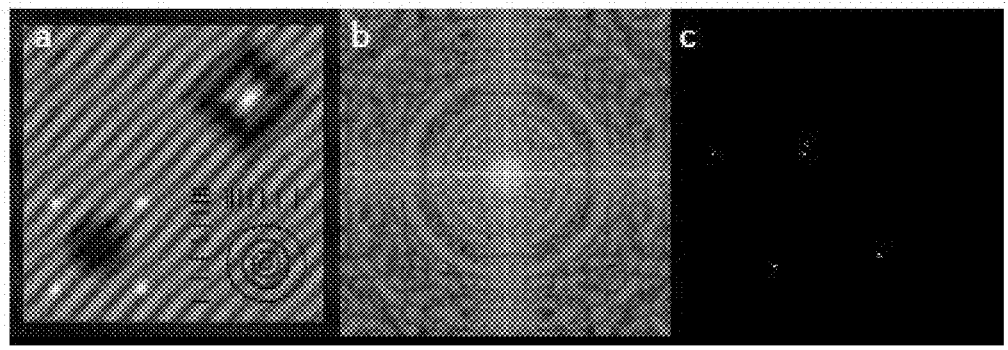
FIGS. 6A-6I show a phantom experiment to evaluate the performance of an algorithm in accordance with the various embodiments with five simulated spikes in a noiseless phantom.
Figures 6D, 6E, 6F:
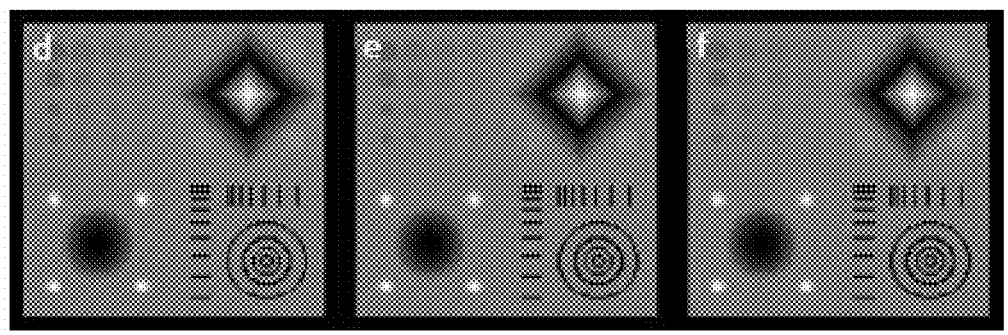
Figures 6G, 6H, 6I:
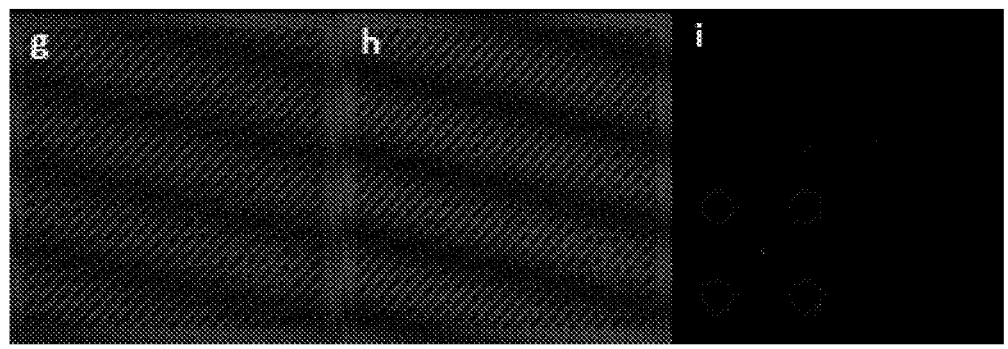

FIGS. 5A-5D shows examples of performance with eight known spikes added to a 64×64 noise-free phantom. FIG. 5A shows the original k-space with spikes as the bright points (DC has been scaled down by the image dimension so that the spikes are more apparent.) FIG. 5B shows the result of the spikes on the image. FIG. 5C shows the spikes inferred or detected by this method. FIG. 5D shows the resulting corrected image after replacing the detected spikes in FIG. 5C with CS reconstructed data.

The spiked k-space in FIG. 5A shows eight spikes (DC signal has been scaled down to bring up the spiked points). The resulting phantom image was severely corrupted, as shown by the lack of detail and the period patterns in FIG. 5B. The method in Algorithm 1 and FIG. 2 was then used to mark the most likely points consisting of spikes, as shown in FIG. 5C. These point s visually correspond to the same eight spikes in FIG. 5A, with two extra locations being marked. Using these identified locations to define the data constraint mask, data for the RF spikes was discarded from the MRI data and the corrected image were reconstructed with CS. The resulting image is shown in FIG. 5D. As can be observed therein, no remaining visual defects remain. The normalized mean square error (NMSE) of the original, spiked-corrupted image (FIG. 5B) was $1.43 \times 10^{-2}$, while the NMSE of the corrected image (FIG. 5D) was $7.08 \times 10^{-9}$.

A second study of the method of Algorithm 1 and FIG. 2 is shown in FIGS. 6A-6I, which show a phantom experiment with five simulated spikes in a noiseless phantom. The original corrupted image (FIG. 6A) and log k-space (FIG. 6B) lead to the automatically generated mask with n=5 (FIG. 6C), which correctly locates the 5 inserted spikes. Comparison between replacement of spikes by zeros (FIG. 6D), k-space linearly interpolated data (FIG. 6E), and CS (FIG. 6F) shows the improvement of the CS approach. The bottom row shows the % difference between corresponding corrected images on the middle row and the ground truth (not shown). All five spikes were correctly located (images FIGS. 6B and 6C) and removed with CS (FIGS. 6F and 6I), while zeroing or interpolating left residual Moiré patterns on the images (FIGS. 6D, 6E, 6G, and 6H). Normalized mean square error in the magnitude image was $\sim 10^{-3}$ for zeroing and interpolating and $\sim 10^{-5}$ for the proposed TV-constrained method.

Figures 7A, 7B, 7C, 7D:
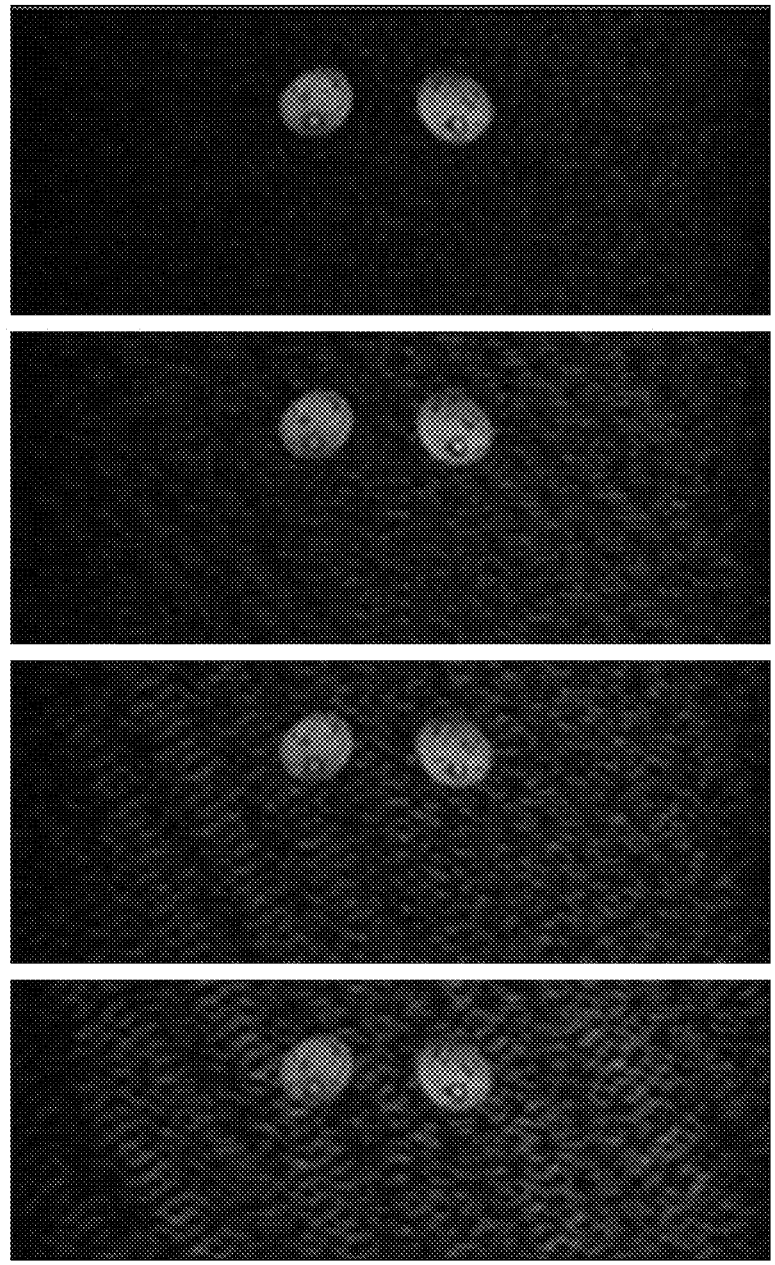
FIGS. 7A-7D show example images corrupted by RF spike noise in a gradient echo scan of the lower legs, with different amounts of correction using an algorithm in accordance with the various embodiments.

In this evaluation, the TV minimization detection method of Algorithm 1 and FIG. 2 was also applied to in vivo gradient echo data that was acquired with a faulty cable so as to provide an unknown number of RF spikes. These results are shown in FIGS. 7A-7D. FIGS. 7A-7D show example images corrupted by RF spike noise in a gradient echo scan of the lower legs. FIG. 7A is an image generated with the original data that has been corrupted by a faulty cable, creating an unknown number of spikes. The remaining images in FIGS. 7B, 7C, and 7D had 5, 10, and 20 data points, respectively, automatically detected and replaced by a method in accordance with Algorithm 1 and FIG. 1. As seen in FIGS. 7A-7D, as the number of data points removed is increased, the image quality is increased. In particular, the periodic or Moiré patterns are reduced or eliminated.

The foregoing results demonstrate a method for detecting and eliminating radio frequency spikes in MRI data that is both more robust and more accurate than existing methods. In particular, the success of the technique is demonstrated on both noiseless phantom data with synthetic spikes and in vivo gradient echo data corrupted with spikes from a faulty cable. TV minimization detection achieved markedly improved images in both cases.

In an additional study, the spike detection methodology of Algorithm 2 and FIG. 3 was applied to a clean gradient echo data set of a healthy brain. This data set was substantially spike free. To simulate the effect of spiking on the data set in a situation in which the positions of the spikes were known, varying numbers of synthetically generated spikes were added to this data. Random locations in the k-space data were replaced with spikes with magnitudes equal to the DC coefficient and having phases randomly chosen between 0 and 2n. Real spikes can, and probably will, have varying amplitudes, but choosing to fix the magnitude allowed the study to concentrate on the detection accuracy in controlled conditions. For example, spikes of smaller magnitude would have been harder to detect, but they also would have a smaller influence on image quality, so the penalty for not detecting them would be smaller. Rather than explore the full problem space of possible spike forms, we chose a simple case for this test. The detection and correction required 7.4 s per case on a GPU-accelerated workstation.

FIGS. 8A-8F show the spike locations (FIGS. 8A and 8D), corrupted images (FIGS. 8B and 8E), and cleaned images (FIGS. 8C and 8F) for two cases. The first case (FIGS. 8A-8C) is the case with the largest number of spikes (243 added) that still achieved perfect recovery. The second case (FIGS. 8D-8F) is the case with the worst corruption (404 spikes added) in which a low-frequency datum was corrupted and our algorithm failed to recover it correctly. In this case, the algorithm labeled several points at low spatial frequencies as spikes (arrow in FIG. 8D) and the severe image artifact can be seen to be a very low spatial frequency feature. This suggests that some of the points deleted and replaced were in fact valid and that they were incorrectly replaced. While Case 2 appears to be a failure of the algorithm, it was notably a case with 404 spikes. Case 1 was corrupted by 243 spikes and still achieved perfect recovery. One can see by comparing FIGS. 8B and 8E to FIGS. 8C and 8F, respectively, how stark the difference is between the corrupted and recovered images. Thus, this illustrates and how dramatically Algorithm 2 cleans up the corrupted images.

Figure 9:
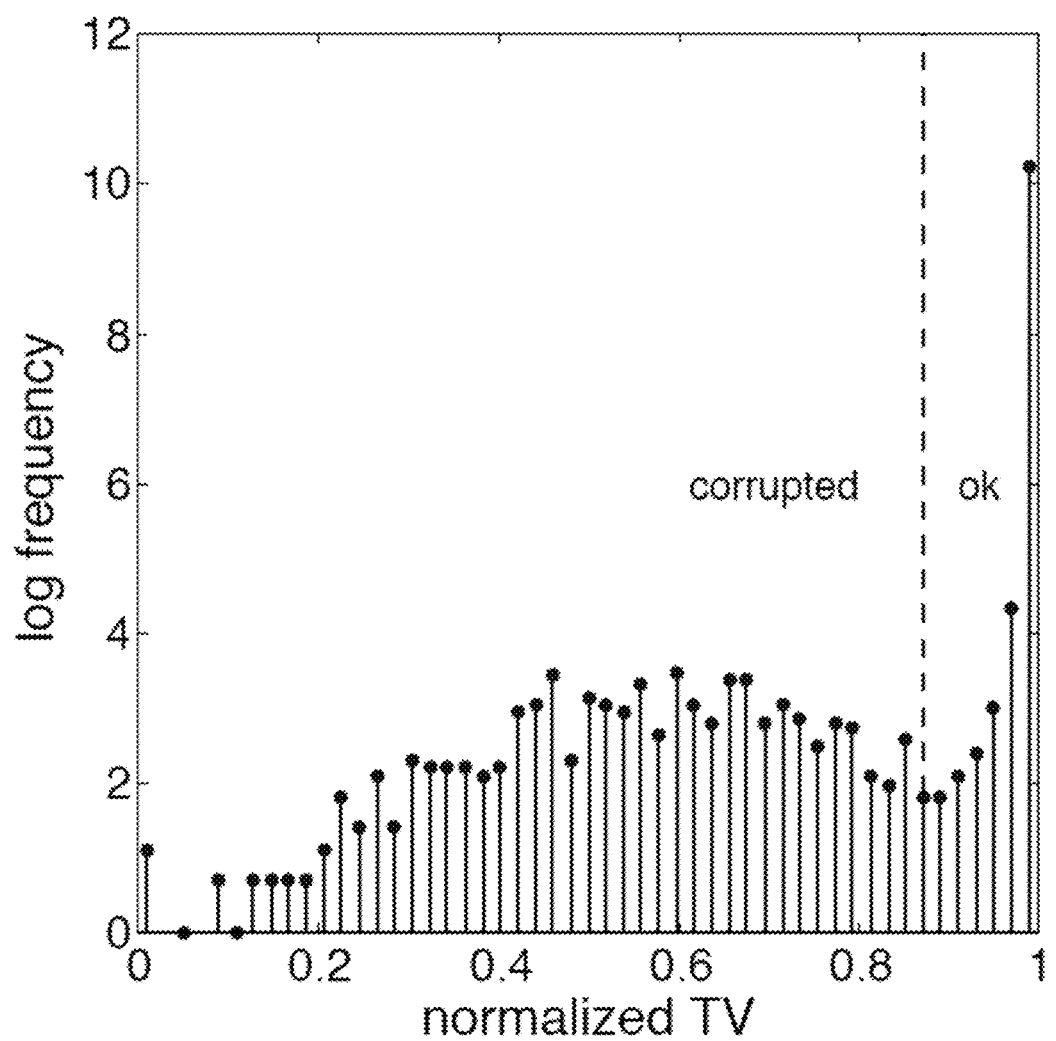
FIG. 9 is a histogram of TV values produced in accordance with the various embodiments when synthetic spikes were added to 7T gradient echo brain data and the upper half discarded.

A demonstration of the way in which Algorithm 2 (relying on Otsu's method) separates spikes from genuine data is shown in FIG. 9. FIG. 9 is a histogram of TV values produced when synthetic spikes were added to 7T gradient echo brain data and the upper half discarded. Here the lower half of the TV values haves been normalized and plotted in a histogram. The vertical dashed line is placed at the cutoff $\sqrt{\theta}$. Data that, when zeroed out, produce TV values less than the cutoff—to the left of the dashed line—are suspected spikes. Points to the right of the line are assumed to be correct. The histogram shows a class distribution of TV values: a broad distribution at low values and a very narrow, highly peaked distribution near unity. Otsu's method chooses a TV cutoff value that minimizes the variance between these two distributions, but the histogram suggests that both distributions have overlapping tails, and hence the detection algorithm may, in case with many spikes, incorrectly label some valid points as spikes and spikes as valid. The goal is to minimize the number of such misclassifications, and Otsu's method is well suited to that goal. Alternatively, using a histogram shape-based method, the valley associated with the dotted line can be recognized and the corresponding TV value is used to select the threshold. In some cases, this can be performed, albeit less accurately, via a user selection. In other cases, a function for the histogram can be defined and the valley can be identified analytically.

To quantitatively evaluate the performance of Algorithm 2, the sensitivity, specificity, and Matthews correlation coefficient of the algorithm were measured as the number of synthetically generated spikes increased using four different fractional powers for the Otsu's threshold: $1/p$, where $p=\{1, 2, 3, 4\}$. The sensitivity and specificity can be written as TP=(TP+FN) and TN=(TN+FP); respectively, where TP is the number of true positives, TN is the number of true negatives, FP is the number of false positives, and FN is the number of false negatives.

Since spike corruption tends to affect only a small fraction of the data set, the usual measure of detection accuracy, defined as (TP+TN)=total points, is unreliable. Instead the Matthews correlation coefficient (MCC) of the classifications produced by Algorithm 2 was evaluated. The MCC can be thought of as a correlation coefficient between the measured and predicted classification of each point ("corrupted" or "ok"). The MCC can be calculated as $$MCC = \frac{TP \times TN - FP \times FN}{\sqrt{(TP+FP)(TP+FN)(TN+FP)(TN+FN)}}. \quad (5)$$

Figure 10A:
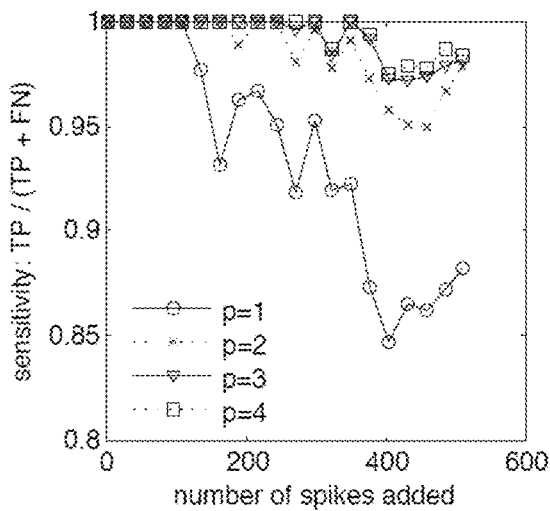
FIG. 10A is a plot of sensitivity of an algorithm in accordance with the various embodiments as a function of the number of spikes for the different fractional powers.
Figure 10B:
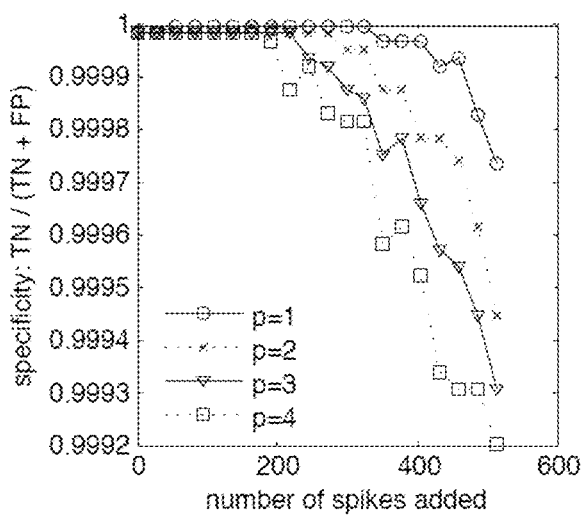
FIG. 10B is a plot of specificity of an algorithm in accordance with the various embodiments as a function of the number of spikes for the different fractional powers.
Figure 10C:
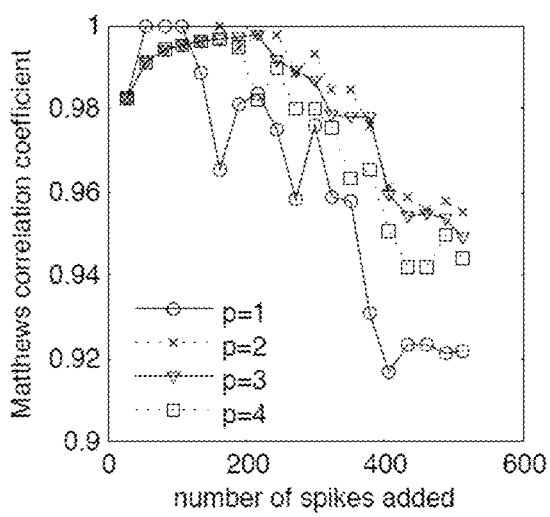
FIG. 10C is a plot of Matthews correlation coefficient of an algorithm in accordance with the various embodiments as a function of the number of spikes for the different fractional powers.

The results of the computation of the foregoing measures are shown in FIGS. 10A-10C. FIG. 10A is a plot of sensitivity as a function of the number of spikes for the different fractional powers. FIG. 10B is a plot of specificity as a function of the number of spikes for the different fractional powers. FIG. 10C is a plot of Matthews correlation coefficient as a function of the number of spikes for the different fractional powers.

As shown in FIGS. 10A-10C, all three measures decline as more spikes were added, presumably because the number of real points that randomly had low TV values increased. Sensitivities were very uniformly high (>0.95) for p>1. The worst sensitivity was 0.85 for p=1 at 404 spikes added. The specificity of the technique is uniformly very high (>0.999) no matter how many spikes were added or the exact value of p. This is because the vast majority of data points were never selected, and even a few false positives are insignificant compared to the total number of data points. Finally, the MCC was above 0.9 for all p up to the maximum number of spikes, but p=2 was the highest at moderate to high spike corruption levels. For very small numbers of spikes, p=1 produced a higher MCC, but all p produced high coefficients (>0:98) at low corruption levels. Since correcting data sets with higher levels of spike correction is a more difficult problem, it appears that p=2 may be the best choice. This thus suggests that the choice of the threshold at $\sqrt{\theta}$ for the cutoff, as used in Algorithm 2.

To test Algorithm 2 under real-world conditions with spikes at uncertain locations, Algorithm 2 was applied to in vivo whole-body fat-water imaging gradient echo data acquired with a damaged RF room shield. RF interference had severely corrupted the data on almost every slice. These data were corrected using Algorithm 2 and then passed to a fat-water separation algorithm to compare the effects of the data scrubbing on derived quantitative parameters. Data from each echo time were processed separately. The total processing time necessary to correct all slices and echoes of this data set was approximately 30 min on a GPU-accelerated workstation using MATLAB R2012a (MathWorks, Natick, Mass.).

Figure 11:
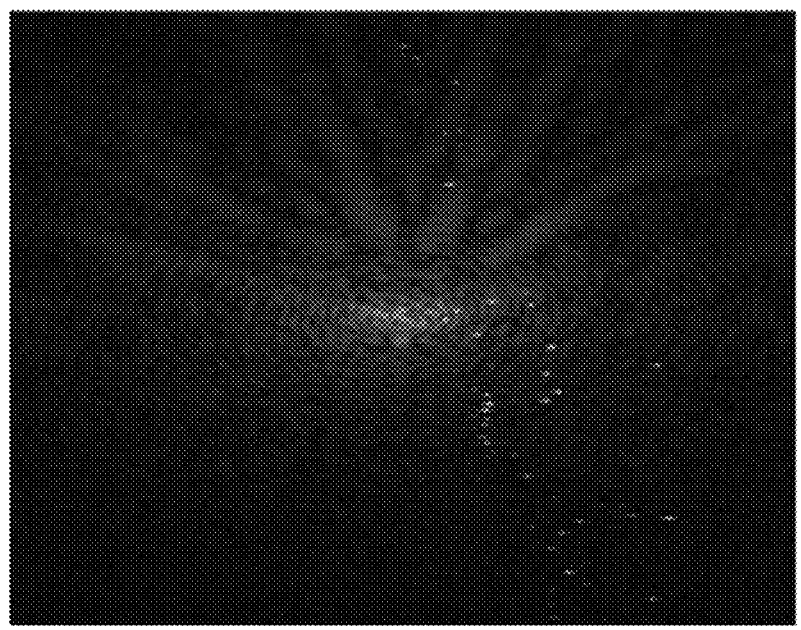
FIG. 11 shows an example of spike corruption in k-space from the fat-water imaging data set acquired in an in vivo experiment.

While the provenance of individual k-space points cannot be fully known in this case, visually the data appeared to contain hundreds of spikes spread across 240 slices. An example slice containing spikes is shown in FIG. 11. FIG. 11 shows an example of spike corruption in k-space from the fat-water imaging data set acquired in an in vivo experiment.

The bright points that do not follow the general pattern of data are almost certainly corrupted. Low intensity features have been scaled up to aid visualization by taking the square root of the magnitude of the coefficients. This is the same data used for the uncorrected images in FIGS. 13A-13F discussed below. Algorithm 2 automatically detected scores of inconsistent points and eliminated them. The resulting reconstructed images were dramatically improved, and as a side-effect many places throughout the derived fat-water images where water and fat fractions were swapped were corrected. This suggests that spike corruption can have a significant effect on derived image quantities. The histogram of TV values produced is shown in FIG. 12. With a much smaller number of spikes in this case, the form of the distribution is not as clear, but the cutoff produced by the algorithm seems to separate the relatively few number of corrupt points from the much more numerous valid points.

Figure 13A:
Figure 13B:
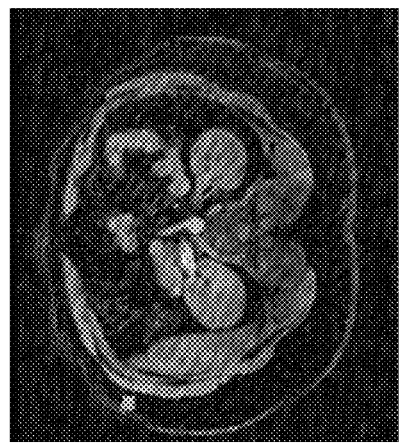
Figure 13C:
Figure 13D:
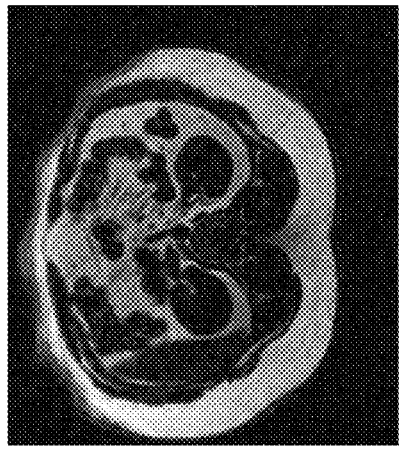
Figure 13E:
Figure 13F:
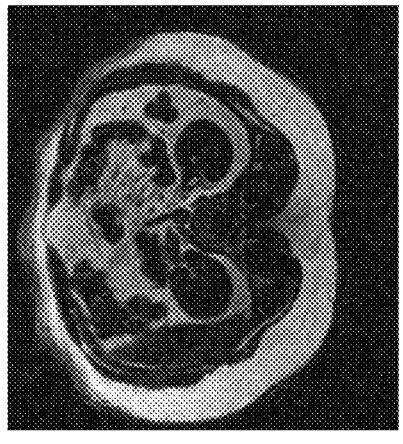

The performance of Algorithm 2 with an unknown number of spikes in real data acquired with a faulty RF room shield during a whole-body gradient echo scan for fat-water imaging, as described above, is shown in FIGS. 13A-13F. FIGS. 13A-3C show the water images and FIGS. 13D-13F show the fat images. The original, corrupted data is shown by FIGS. 13B and 13E. The degradation in image quality is clear for these images, and an area of fat misclassification is visible in the upper left (patient right anterior) of the images. After running Algorithm 2 on the data, the images are significantly cleaned. FIGS. 13A and 13D show the case where the corrupted data was replaced with zeros. FIGS. 13C and 13F show the case using a compressed sensing reconstruction. Replacing the spikes with zeros resulted in a 42% artifact level reduction and the CS reconstruction provided a 47% artifact level reduction, an additional 5% reduction. Accordingly, not only were corrupted points correctly located, but they were replaced with enough accuracy to improve the separation of water and fat in the imaging data.

As shown above, reconstructing the corrupted data with CS reconstruction technique provides only a small (11% relative) improvement over replacing the spiked data with zeroes. However, it demonstrates the ability of CS to accurately estimate missing data. The use of CS is justified here because the points deleted were chosen because of their effect on the TV, and CS replaces data such that the TV effect is minimized. Given the small effect of CS, though, it is clear that detection and replacement of spikes, even with zeroes, is more important than implementing the ability to reconstruct the missing data with CS.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A method for processing magnetic resonance imaging (MRI) data, comprising:
   receiving MRI data comprising a plurality of k-space points for an image data set;
   deriving a plurality of different versions of the image data set based on the MRI data, each of the plurality of different versions of the image set obtained by zeroing a different one of the plurality of k-space points;
   computing image space metric values for each of the plurality of different versions of the image data set;
   identifying zeroed ones of the plurality of k-space points for each of the plurality of different versions of the image data set for which the at least one image space metric value fails to meet a threshold value; and
   adjusting a portion of the MRI data associated with the identified zeroed ones of the plurality of k-space points to yield adjusted MRI data.

2. The method of claim 1, further comprising:
   generating a final image from the adjusted MRI data.

3. The method of claim 1, wherein the adjusting comprises setting values of each of the k-space points in the portion of the MRI data to zero.

4. The method of claim 1, wherein the adjusting comprises computing new values of each of the k-space points in the portion of the MRI data using a constrained reconstruction.

5. The method of claim 1, wherein the image space metric values comprise total variation values, and wherein the adjusting further comprises identifying the portion of the MRI data by:
   sorting the image space metric values to yield sorted total variation values;
   defining a function of the sorted total variation values as a function of a logarithm of sorted position;
   selecting a critical image space metric value associated with the shoulder of the function closest to the median as the threshold; and
   selecting as the portion of the MRI data, at least a portion of the sorted image space metric below the threshold.

6. The method of claim 5, wherein defining the function further comprises:
   reversing the sorted total variation values; and
   discarding values greater than a median of the sorted total variation values.

7. The method of claim 1, wherein the adjusting further comprises defining the threshold value by:

discarding a portion of the image space metric values greater than a median of the image space metric values to yield remaining image space metric values;

computing a class threshold for the remaining image space metric values;

selecting as the portion of the MRI data, at least a portion of the sorted image space metric below the class threshold.

8. A system for processing magnetic resonance imaging (MRI) data, comprising:

a processor;

a computer-readable medium comprising a plurality of instructions for causing the processor to perform the method comprising:

receiving MRI data comprising a plurality of k-space points for an image data set;

deriving a plurality of different versions of the image data set based on the MRI data, each of the plurality of different versions of the image set obtained by zeroing a different one of the plurality of k-space points;

computing image space metric values for each of the plurality of different versions of the image data sets;

identifying zeroed ones of the plurality of k-space points for each of the plurality of different versions of the image data set for which the at least one image space metric value fails to meet a threshold value; and adjusting a portion of the MRI data associated with ones of the image space metric values that fail to meet a threshold value to yield adjusted MRI data.

9. The system of claim 8, the computer readable medium further comprising instruction for causing the processor to generate a final image from the adjusted MRI data.

10. The system of claim 8, wherein the adjusting comprises setting values of each of the k-space points in the portion of the MRI data to zero.

11. The system of claim 8, wherein the adjusting comprises computing new values of each of the k-space points in the portion of the MRI data using a constrained reconstruction.

12. The system of claim 8, wherein the adjusting further comprises identifying the portion of the MRI data by:

sorting the image space metric values to yield sorted image space metric values;

defining a function of the sorted image space metric values as a function of the logarithm of sorted position;

selecting a critical image space metric value associated with the shoulder of the function closest to the median as the threshold; and selecting as the portion of the MRI data, at least a portion of the sorted image space metric below the threshold.

13. The system of claim 12, wherein defining the function further comprises:

reversing sorted image space metric values; and discarding values greater than a median of the sorted image space metric values.

14. The system of claim 8, wherein the adjusting further comprises defining the threshold value by:

discarding a portion of the image space metric values greater than a median of the image space metric values to yield remaining image space metric values;

computing a class threshold for the remaining image space metric values;

selecting as the portion of the MRI data, at least a portion of the sorted image space metric below the class threshold.

15. A non-transitory computer-readable medium having stored thereon a plurality of instructions for causing a computing device to perform a method for processing magnetic resonance imaging (MRI) data, the plurality of instructions comprising code sections for:

receiving MRI data comprising a plurality of k-space points for an image data set;

deriving a plurality of different versions of the image data set based on the MRI data, each of the plurality of different versions of the image set obtained by zeroing a different one of the plurality of k-space points;

computing image space metric values for each of the plurality of different versions of the image data set;

adjusting a portion of the MRI data associated with the identified zeroed ones of the plurality of k-space points to yield adjusted MRI data.

16. The non-transitory computer-readable medium of claim 15, further comprising code sections for:

generating a final image from the adjusted MRI data.

17. The non-transitory computer-readable medium of claim 15, wherein the adjusting comprises setting values of each of the k-space points in the portion of the MRI data to zero.

18. The non-transitory computer-readable medium of claim 15, wherein the adjusting comprises computing new values of each of the k-space points in the portion of the MRI data using a constrained reconstruction.

19. The non-transitory computer-readable medium of claim 15, wherein the adjusting further comprises identifying the portion of the MRI data by:

sorting the image space metric values to yield sorted image space metric values;

defining a function of the sorted image space metric values as a function of the logarithm of sorted position;

selecting a critical image space metric value associated with the shoulder of the function closest to the median as the threshold; and selecting as the portion of the MRI data, at least a portion of the sorted image space metric below the threshold.

20. The non-transitory computer-readable medium of claim 15, wherein the adjusting further comprises defining the threshold value by:

discarding a portion of the image space metric values greater than a median of the image space metric values to yield remaining image space metric values;

computing a class threshold for the remaining image space metric values;

selecting as the portion of the MRI data, at least a portion of the sorted image space metric below the class threshold.

\* \* \* \* \*

UNITED STATES PATENT AND TRADEMARK OFFICE
CERTIFICATE OF CORRECTION

PATENT NO. : 9,042,623 B2  
APPLICATION NO. : 13/785574  
DATED : May 26, 2015  
INVENTOR(S) : David S. Smith et al.

Page 1 of 1

It is certified that error appears in the above-identified patent and that said Letters Patent is hereby corrected as shown below:

On title page 1, column 2, item (74) Attorney, Agent, or Firm the spelling for "Nocak Druce Connolly Bove + Quigg LLP" should read -- Novak Druce Connolly Bove + Quigg LLP --

Signed and Sealed this  
Seventeenth Day of November, 2015

Michelle K. Lee  
*Director of the United States Patent and Trademark Office*